(12) United States Patent
Voor et al.

(10) Patent No.: US 6,697,016 B1
(45) Date of Patent: Feb. 24, 2004

(54) SELF ADJUSTMENT OF A FREQUENCY OFFSET IN A GPS RECEIVER

(75) Inventors: Thomas E. Voor, Lauderhill, FL (US); Ronald H. Deck, Cooper City, FL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/260,940

(22) Filed: Sep. 30, 2002

(51) Int. Cl.[7] ............... G01S 5/02; H04B 7/185
(52) U.S. Cl. ............... 342/357.15; 342/357.06; 342/357.12; 701/213
(58) Field of Search ............... 342/357.15, 357.06, 342/357.12; 701/213

(56) References Cited

U.S. PATENT DOCUMENTS

| | | |
|---|---|---|
| 5,742,908 A | 4/1998 | Dent |
| 5,841,396 A | 11/1998 | Krasner |
| 6,122,506 A | 9/2000 | Lau et al. |
| 6,362,700 B1 | 3/2002 | Fry |
| 6,510,387 B2 * | 1/2003 | Fuchs et al. ............... 701/213 |

* cited by examiner

Primary Examiner—Theodore M. Blum
(74) Attorney, Agent, or Firm—Scott M. Garrett

(57) ABSTRACT

A global positioning system (GPS) receiver (102) has a reference oscillator (114) for use in synthesizing signals for use in receiving and acquiring GPS satellite signals by a GPS downconverter (110). Upon manufacture of the receiver (204), the receiver is tested and a factory frequency offset of the oscillator is determined (206). It has been found that the heat used in reflowing the solder used to attach receiver components causes the operating frequency of oscillator devices, such as crystals, to shift considerably. In addition, during a brief period after manufacture of the receiver, the frequency of the oscillator shifts back towards its original operating frequency, and so much so that the narrow search window used to search for a GPS carrier is inadequate, and it is likely that the receiver would not locate the desired carrier signal. The invention takes advantage of the time period after manufacture, when the frequency of the oscillator settles, and the first time unit is turned on, the receiver is used proactively with a wide search window (212) to determine an operating frequency offset. Then, for subsequent location determination operations, a narrow search window is used (222).

16 Claims, 2 Drawing Sheets

SELF ADJUSTMENT OF A FREQUENCY OFFSET IN A GPS RECEIVER

TECHNICAL FIELD

This invention relates in general to location determining apparatus using satellite signals, and more particularly to satellite positioning receivers which have frequency errors introduced during manufacture of the receiver, and where such errors change over a period of time after manufacturing the receiver.

BACKGROUND OF THE INVENTION

Satellite positioning receivers have been employed for a number of years, and are now implemented in integrated circuit form, making them both relatively small and inexpensive compared to their size and cost only a few years ago. Consequently, satellite positioning receivers are being used in many more applications than they have been in the past. For example, it is now relatively common to find them in automobiles for use with mapping and navigation equipment.

Presently, in their most common form, satellite positioning receivers are provided in integrated circuit form, and require the addition of some periphery circuits, such as reference oscillators. Of course, reference oscillators can be provided with oscillator circuits that are stable and precise. In general, thermal stability and precision are a function of cost. That is, the more stable and precise the oscillator circuit, the more it will cost, in general. However, in cost sensitive consumer electronics, it is desirable to use inexpensive circuitry.

Among the less expensive means of implementing oscillators, crystal oscillators are relatively stable and precise for their cost. Although other inexpensive and unsophisticated oscillator means exit, crystal oscillators are one of the most widely used circuits in electronic equipment. For most consumer electronics, crystal oscillators are stable and precise enough, and typically do not require correction. However, it is typical for crystal oscillators, as well as other types of oscillators, to be specified with a frequency precision measured in parts per million. For example, a crystal oscillator with a nominal operating frequency of 10 megahertz (MHz), with an error of ±5 parts per million (ppm) will have a frequency error of ±50 Hz. Although small in comparison to the nominal frequency, it is an unacceptable error in frequency sensitive applications, such as communications applications where channels are specified by frequency. A 50 Hz error could easily cause a communication signal to drift into a channel adjacent to the intended channel.

There are a number of techniques used to correct frequency errors. These techniques are not exclusive, so their corrective effect may be aggregated to establish a precise reference oscillator. For example, more precise oscillators are available, so instead of using a 5.0 ppm oscillator device, the designer may choose to use a lower tolerance part having a precision of 0.5 ppm. A common technique is to use automatic frequency correction (AFC). AFC can be performed by a variety of techniques. One of the more common techniques in communication device is where the device receives a precision carrier signal and compares its internal oscillator frequency to the received precision carrier to determine a frequency error or offset. The offset is used to correct the reference oscillator frequency by, for example, a frequency synthesizer or other frequency dependent operators within the device.

Despite the use of more precise oscillator devices, it has been found that, as a result of manufacturing processes, the frequency of an oscillator device can change more than its specified tolerance. For example, the 0.5 ppm can apply over temperature over a short period of time, but the crystal can experience larger changes over greater periods of time due to aging or mechanical shock, or both. Specifically, when, for example, a crystal oscillator device is exposed to intense heat, such as during circuit board solder reflow, a crystal having a 0.5 ppm specified tolerance can change by as much as ten times that, or 5.0 ppm. Furthermore, for a period of time after exposure to high heat, the crystal frequency will continue to change back towards its nominal frequency. The period of time typically lasts about 2 days, and then the crystal frequency will settle, and thereafter the changes in frequency will be relatively small, assuming the device is not exposed to any high temperatures. This change in frequency causes a problem because after manufacture of the device, the device is typically tested and tuned. If the device is tested and tuned at a time shortly after manufacture, the tuning will be ineffective because by the time a user is ready to use the device, the operating frequency of the oscillator will have changed from what it was shortly after manufacture. It is typically expected that the frequency will change, and in devices that receive signals, there is a range of frequency the device will search to acquire a carrier signal, and then the device will correct its frequency offset, if necessary. However, it has been found that in some instances, the frequency may change so much between the time the device is initially tested and the first time it is used by an end user that the search window may not be broad enough to locate a desired carrier signal. A broader search window could be used, but a broader search window increases the amount of time a device may search for a desired carrier signal. Therefore there is a need for a means by which oscillator frequency change subsequent to manufacture of the device is accommodated without impacting the search time during regular operation.

DETAILED DESCRIPTION OF A PREFERRED EMBODIMENT

Figure 1:
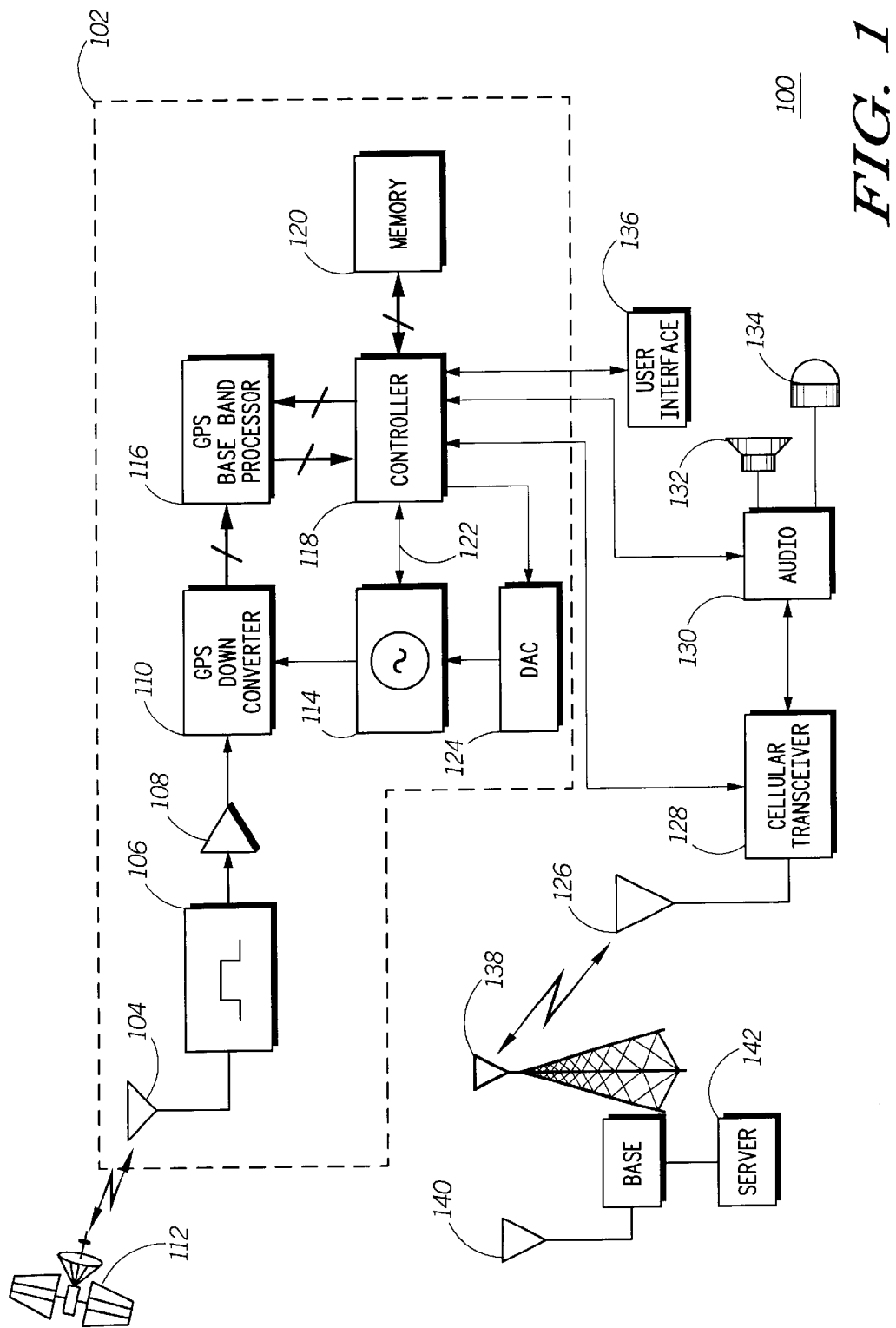
FIG. 1 shows a schematic block diagram of global positioning satellite (GPS) receiver, in accordance with the invention.

While the specification concludes with claims defining the features of the invention that are regarded as novel, it is believed that the invention will be better understood from a consideration of the following description in conjunction with the drawing figures, in which like reference numerals are carried forward.

The invention solves the problem by using two different search window frequency ranges. Using the frequency error setting determined during testing of the receiver subsequent to manufacture of the receiver, a wide search window is initially used in conjunction with the factory set frequency error or offset. Once the desired carrier is acquired, a new frequency offset is determined and the narrow frequency search window is used thereafter. In one embodiment of the invention, this procedure is undertaken the first time the device is powered up after factory testing. In another embodiment of the invention, if the receiver does not detect or acquire the desired carrier using the wide frequency search window, a message is displayed to the user of the receiver to move the receiver to a location with an open view of the sky on the assumption that the user is in an indoor, or otherwise obstructed location.

Referring now to FIG. 1, there is shown a schematic block diagram 100 of global positioning satellite (GPS) receiver 102, in accordance with the invention. The GPS receiver has a front end including an antenna 104, filter 106, and amplifier 108. The front end components are tuned to receive and amplify signals received in the desired frequency band broadcast by satellites 112. It should be noted that although the exemplary embodiments discussed herein pertain to GPS systems, it is contemplated that the invention will apply equally to other receiver applications, including other satellite positioning systems. The amplifier 108 provides a filtered and amplified signal to a GPS downconverter 110. The downconverter comprises a frequency synthesizer and down mixer, and synthesizes frequencies in the GPS frequency band using a reference signal from a reference oscillator 114. Although GPS satellites all broadcast at the same frequency, their present location and direction of movement relative to the receiver causes Doppler shifts in the received signal, as is well known. In fact, the determination of the Doppler error is used in the calculation of the receiver's position. The synthesized signals are mixed with the signal received from the front end to produce a baseband signal, which is fed to a GPS baseband processor 116 along with information regarding the present Doppler error used by the downconverter. The baseband processor performs correlation to determine if a GPS signal is being received at the frequency presently synthesized by the GPS downconverter. It takes into account the offset error of the reference oscillator which is provided by a controller 118, which fetches the offset error from a memory 120. However, upon the acquisition of a sufficient number of satellite signals, the GPS baseband processor can determine if the present offset is correct. If not, a new offset is passed to the controller which stores the new offset in the memory. The controller also passes search window parameters to the GPS baseband processor which determine the frequency range searched by the baseband processor.

In the preferred embodiment, the reference oscillator 114 is a crystal oscillator, such as a temperature compensated crystal oscillator. In an alternative receiver design, the controller can monitor the oscillator via a communication interface 122, and adjust the frequency of the oscillator by means of a digital to analog controller (DAC) 124. The controller supplies a digital value to the DAC, which converts the digital value to a control voltage. The control voltage is applied to the oscillator in a manner well known in the art to adjust the reference oscillator.

One desirable application of location determining equipment, such as a GPS receiver, is to use the GPS receiver in a mobile communication device. A GPS enabled mobile communication device is of particular benefit in emergency situations, where the user may not know, or may not be able to relate their position to an emergency services operator.

A typical mobile communication device comprises an antenna for sending and receiving RF signals. The antenna is coupled to a transceiver 128. The transceiver comprises amplifiers, up mixer, down mixer, frequency synthesizer, AFC, signal processing circuits, and so on, as is known in the art. The transceiver operates under control of the controller 118, and operates in conjunction with an audio processor 130. The audio processor plays voice signals it receives from the transceiver over a speaker 132, and receives voice signals generated by the user of the mobile communication device through a microphone 134. A user interface 136, comprising such common elements as a display and keypad and other buttons, allows the user to operate the mobile communication device and GPS receiver. The mobile communication device communicates with a base station 138, which establishes a serving cell or service area in the vicinity of the base station. Because the time to obtain a location fix in an autonomous mode, without assistance, can be much longer than desirable in an emergency situation, it is desirable to aid the GPS receiver by sending aiding information to the GPS receiver, via the mobile communication device link with the base station. The aiding information can be obtained either from a local GPS receiver 140 at the station, or from a location aiding server 142 which is accessible by the base station over a network. Aiding information includes, for example, ephemeris information for satellites presently in view, frequency correction, and so on. However, according to the present invention, the reference oscillator 114 of the GPS receiver is not corrected by means of aiding from the cellular base station, or other means associated with wireless communication services network to which the base station is connected.

Figure 2:
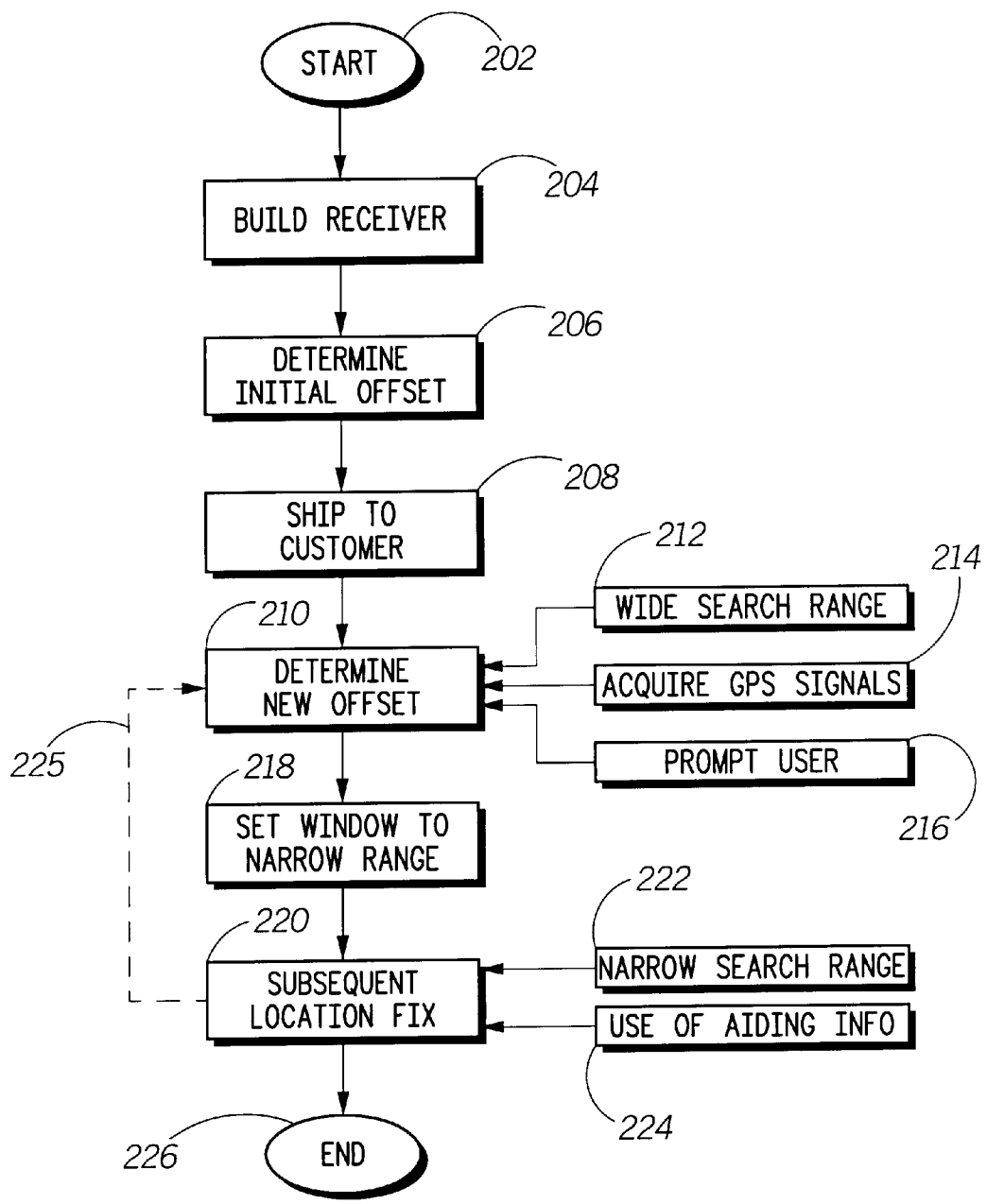
FIG. 2 shows a flow chart diagram of a method for self correcting a frequency offset in a GPS receiver, in accordance with the invention.

Referring now to FIG. 2, there is shown a flow chart diagram 200 of a method of self correcting a frequency offset in a GPS receiver, in accordance with the invention. At the start 202 of the process, the receiver is assembled from components, including an oscillator means such as a crystal oscillator. During manufacture (204) of the receiver, the receiver is subjected to intense heat, such as occurs during solder reflow, which causes the operating frequency of the oscillator device to shift. Subsequent to the manufacture of the receiver, when the receiver has cooled sufficiently, it is tested and tuned. During the factory testing, the receiver is fed a precision carrier signal so that it can determine the frequency offset of its reference oscillator (206). This initial frequency offset is referred to as the factory frequency offset. The offset is a value representing the difference of the actual present operating frequency of the reference oscillator from its nominal frequency. Once the factory frequency offset is determined, it is stored in a non-volatile memory of the receiver, or the mobile communication device if the GPS receiver is built into the mobile communication device.

Typically, subsequent to manufacture, the receiver is temporarily stored, and then shipped (208) to a store or perhaps directly to a customer. The time period between manufacture and receipt by an end customer will usually be on the order of days, if not longer. During this period of inactivity, it has been discovered that the operating frequency of the oscillator will shift a significant amount, and typically by more than its rated frequency tolerance over temperature. That is, even though an oscillator device may be rated with a 0.5 ppm tolerance over temperature, it may shift by as much as 5.0 ppm during this initial settling period. If a typical search for a carrier is undertaken with the factory frequency offset, the receiver may not detect the desired carrier because the frequency of the reference oscillator has changed so much, and because such searches are typically limited in frequency range to some pre-set window or range. If the receiver doesn't find the desired carrier in the frequency window, it is assumed that no carrier is present. Therefore, according to the invention, the receiver commences determining an operating frequency offset (210) using a wide frequency range search window 212. The width, in terms of frequency range, of the wide search window is selected based on the particular design, and the oscillator response to the manufacturing process and the subsequent frequency shift over the period immediately after manufacture. In a preferred embodiment of the invention, the oscillator is a temperature compensated crystal oscillator having a tolerance of 0.5 ppm, and the wide search window has a range of 5.0 ppm. Upon commencing the initial search to determine the new frequency offset, referred to as the operating frequency offset, the receiver must acquire a GPS satellite signal 214. The receiver does this by beginning a search using the factory frequency offset, and searching the spectrum around the resulting frequency, and within the wide search window. The receiver may prompt the user of the receiver (216) to move the receiver to a clear sky or unobstructed location to assist in acquiring the satellite signal. The prompting may be routine and automatic the first time the receiver attempts to acquire a GPS satellite signal, or it may be upon searching the entire search window and not locating a GPS satellite carrier signal. The prompting is easily performed by, for example, displaying a message on a display of the receiver or mobile communication device incorporating the receiver. An audio signal may be used as an alternative, or in conduction with the text message. Once the receiver acquires GPS satellite signals, it can determine the present frequency offset of the reference oscillator. The frequency offset determined at this time becomes the operating frequency offset for subsequent operation (220), subject to small changes, and is stored in non-volatile memory for use with the receiver. It is expected that this frequency offset will be substantially different than the factory frequency offset. Furthermore, because it is expected that the oscillator frequency will be relatively stable henceforth, and changes will not exceed the specified tolerance of the oscillator device, a narrow search window 222 is used for subsequent location determination operation. The narrow frequency search window needs not be any wider than the normal operating tolerance of the oscillator device. In the preferred embodiment, a 0.5 ppm temperature compensated oscillator is used, and the narrow search window encompasses a frequency range of not more than 0.5 ppm of the nominal frequency of the oscillator, or a range substantially equal to the specified frequency tolerance over temperature of the reference oscillator. In subsequent location determination operations, the receiver may use certain aiding information (224) obtained, for example, from a cellular mobile communication network, as known in the art. During subsequent location determination operations, as mentioned before, the frequency offset may change, and in which case the new frequency offset will be stored. It is contemplated that if, while using the narrow frequency search range, a signal is detected, but it is what would be considered a weak signal, the GPS receiver may prompt the user to move to an unobstructed location to increase the strength of the signal and reduce the location determination time. Furthermore, it is contemplated that, while searching using the narrow frequency range search window, if no signal is found, the GPS receiver may revert (225) to using the wide frequency range search window. In one embodiment of the invention, the GPS receiver is incorporated into a mobile communication device for use in location determination in conjunction with calling for emergency services. Because of the long time needed to obtain a first fix, it is contemplated that the first fix be undertaken the first time the mobile communication device is powered on. By fix it is meant determining the present location of the device, and therefore the present frequency offset error. Additionally, it is contemplated that the offset error stored in the memory of the device may be dated, and if a substantial period of time has passed since the last time the GPS receiver has been used, the GPS receiver may initiate searching using the wide frequency range window.

Therefore the invention provides a method of performing self adjustment of a frequency offset in a global positioning system (GPS) receiver to correct frequency error introduced during manufacture of the GPS receiver, commencing with determining a factory frequency offset of a reference oscillator of the GPS receiver upon manufacture of the GPS receiver. After determining the factory frequency offset, the receiver commences searching for a GPS satellite signal using the factory frequency offset and a wide frequency range search window for the purpose of acquiring a GPS satellite signal. Upon acquiring the GPS signal, the receiver commences determining an operating frequency offset of the reference oscillator of the GPS receiver from a frequency of the GPS satellite signal. For subsequent location determination operations the receiver acquires satellite signals using a narrow frequency range search window. In a preferred embodiment of the invention, the reference oscillator has a nominal frequency, and determining the operating frequency offset is performed with the wide frequency window range set to at least 3.0 parts per million of the nominal operating frequency of the reference oscillator. The invention is applicable particularly to crystal oscillators, including temperature compensated crystal oscillators. The invention may include, upon commencing searching for the GPS signal, displaying a message on a display of the GPS receiver, including a display of a mobile communication device into which the GPS receiver has been incorporated, instructing a user of the GPS receiver to move the GPS receiver to an unobstructed location. Displaying the message may be performed automatically, or after searching of the GPS satellite signal and not finding the GPS satellite signal after a period of time.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of performing self adjustment of a frequency offset in a global positioning system (GPS) receiver to correct frequency error of a reference oscillator of the GPS receiver, comprising:

determining a factory frequency offset of the reference oscillator of the GPS receiver upon manufacture of the GPS receiver;

after determining the factory frequency offset, searching for a GPS satellite signal using the factory frequency offset and a wide frequency range search window;

after commencing searching for the GPS signal, acquiring a GPS satellite signal;

upon acquiring the GPS signal, determining an operating frequency offset of the reference oscillator of the GPS receiver from a frequency of the GPS satellite signal; and upon determining the operating frequency offset, thereafter using a narrow frequency range search window for subsequently acquiring GPS satellite signals.

2. A method of performing self adjustment of a frequency offset in a GPS receiver as defined in claim 1, wherein determining the operating frequency offset is performed with the wide frequency range search window set wider than a specified frequency tolerance over temperature of the reference oscillator.

3. A method of performing self adjustment of a frequency offset in a GPS receiver as defined in claim 1, wherein determining the frequency offset is performed by determining the factory frequency offset and determining the operating frequency offset are preformed by determining the frequency offset of a reference crystal oscillator.

4. A method of performing self adjustment of a frequency offset in a GPS receiver as defined in claim 3, wherein determining the frequency offset is performed by determining the factory frequency offset and determining the operating frequency offset are preformed by determining the frequency offset of a temperature compensated reference crystal oscillator.

5. A method of performing self adjustment of a frequency offset in a GPS receiver as defined in claim 1, wherein, upon determining the operating frequency offset, thereafter using a frequency range search window substantially equal to a frequency tolerance over temperature of the reference oscillator for subsequently acquiring GPS satellite signals.

6. A method of performing self adjustment of a frequency offset in a GPS receiver as defined in claim 1, wherein upon commencing searching for the GPS signal, displaying a message on a display of the GPS receiver instructing a user of the GPS receiver to move the GPS receiver to an unobstructed location.

7. A method of performing self adjustment of a frequency offset in a GPS receiver as defined in claim 6, wherein displaying the message is performed after searching of the GPS satellite signal and not finding the GPS satellite signal after a period of time.

8. A method of performing self adjustment of a frequency offset in a mobile communication device having a global positioning system (GPS) receiver to correct frequency error of a reference oscillator of the GPS receiver, comprising:

determining a factory frequency offset of the reference oscillator of the GPS receiver upon manufacture of the GPS receiver;

after determining the factory frequency offset, searching for a GPS satellite signal using the factory frequency offset and a wide frequency range search window;

after commencing searching for the GPS signal, acquiring a GPS satellite signal;

upon acquiring the GPS signal, determining an operating frequency offset of the reference oscillator of the GPS receiver from a frequency of the GPS satellite signal; and upon determining the operating frequency offset, thereafter using a narrow frequency range search window and aiding information received from a source outside of the mobile communication device for subsequently acquiring GPS satellite signals.

9. A method of performing self adjustment of a frequency offset in a mobile communication device having a GPS receiver as defined in claim 8, wherein determining the operating frequency offset is performed with the wide frequency window range search window set wider than a specified frequency tolerance over temperature of the reference oscillator.

10. A method of performing self adjustment of a frequency offset in a mobile communication device having a GPS receiver as defined in claim 8, wherein determining the frequency offset is performed by determining the factory frequency offset and determining the operating frequency offset are preformed by determining the frequency offset of a reference crystal oscillator.

11. A method of performing self adjustment of a frequency offset in a mobile communication device having a GPS receiver as defined in claim 10, wherein determining the frequency offset is performed by determining the factory frequency offset and determining the operating frequency offset are preformed by determining the frequency offset of a temperature compensated reference crystal oscillator.

12. A method of performing self adjustment of a frequency offset in a mobile communication device having a GPS receiver as defined in claim 8, wherein, upon determining the operating frequency offset, thereafter using a frequency range search window substantially equal to a frequency tolerance over temperature of the reference oscillator for subsequently acquiring GPS satellite signals.

13. A method of performing self adjustment of a frequency offset in a mobile communication device having a GPS receiver as defined in claim 8, wherein upon commencing searching for the GPS signal, displaying a message on a display of the GPS receiver instructing a user of the GPS receiver to move the GPS receiver to an outdoor location.

14. A method of performing self adjustment of a frequency offset in a mobile communication device having a GPS receiver as defined in claim 13, wherein displaying the message is performed after searching of the GPS satellite signal and not finding the GPS satellite signal after a period of time.

15. A method of performing self adjustment of a frequency offset in a mobile communication device as defined in claim 8, wherein upon commencing searching for the GPS signal, displaying a message on a display of the GPS receiver instructing a user of the GPS receiver to move the GPS receiver to an unobstructed location.

16. A method of performing self adjustment of a frequency offset in a global positioning system (GPS) receiver to correct frequency error of a reference oscillator of the GPS receiver, comprising:

searching for a GPS satellite signal using a wide frequency range search window;

after commencing searching for the GPS signal, acquiring a GPS satellite signal;

upon acquiring the GPS signal, determining an operating frequency offset of the reference oscillator of the GPS receiver from a frequency of the GPS satellite signal; and upon determining the operating frequency offset, thereafter using a narrow frequency range search window for subsequently acquiring GPS satellite signals.

* * * * *